(12) United States Patent
Vobecky

(10) Patent No.: US 10,115,834 B2
(45) Date of Patent: Oct. 30, 2018

(54) METHOD FOR MANUFACTURING AN EDGE TERMINATION FOR A SILICON CARBIDE POWER SEMICONDUCTOR DEVICE

(71) Applicant: ABB Schweiz AG, Baden (CH)

(72) Inventor: Jan Vobecky, Lenzburg (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/837,544

(22) Filed: Dec. 11, 2017

(65) Prior Publication Data

US 2018/0108789 A1    Apr. 19, 2018

Related U.S. Application Data

(63) Continuation of application No. PCT/EP2016/062876, filed on Jun. 7, 2016.

(30) Foreign Application Priority Data

Jun. 9, 2015    (EP) .................................... 15171208

(51) Int. Cl.
*H01L 29/87*    (2006.01)
*H01L 29/872*    (2006.01)
(Continued)

(52) U.S. Cl.
CPC ........ *H01L 29/872* (2013.01); *H01L 29/0619* (2013.01); *H01L 29/1608* (2013.01);
(Continued)

(58) Field of Classification Search
CPC ............... H01L 29/872; H01L 29/0619; H01L 29/7395; H01L 29/1608; H01L 29/6606; H01L 29/868
See application file for complete search history.

(56) References Cited

U.S. PATENT DOCUMENTS 7,199,442 B2 *    4/2007    Shenoy ............... H01L 21/0495
257/155
8,587,025 B1    11/2013    Schulze et al.
(Continued)

FOREIGN PATENT DOCUMENTS

EP    2045844 A1    4/2009
WO    2009108268 A1    9/2009

OTHER PUBLICATIONS

European Patent Office, International Search Report & Written Opinion issued in corresponding Application No. PCT/EP2016/062876, dated Sep. 27, 2016, 15 pp.
(Continued)

*Primary Examiner* — William Coleman
(74) *Attorney, Agent, or Firm* — Taft Stettinius & Hollister LLP; J. Bruce Schelkopf

(57) ABSTRACT

A method for manufacturing an edge termination structure for a silicon carbide power semiconductor device having a central region and an edge region is provided. The following manufacturing steps are performed: a) providing an n-doped silicon carbide substrate, b) epitaxially growing a silicon carbide n-doped drift layer on the substrate, which has a lower doping concentration than the substrate, c) creating at least one p-doped termination layer by implanting a second ion up to a maximum termination layer depth and annealing on the first main side, d) forming a doping reduction layer having a depth range, which doping reduction layer comprises at least one doping reduction region, wherein a depth of a doping concentration minimum of the doping reduction layer is greater than the maximum termination layer depth, wherein for the creation of each doping reduction region: implanting a first ion with an implantation energy in the drift layer at least in the edge region, wherein the first ion and the at least one implantation energy are chosen such that the doping reduction layer depth range is less than 10 μm, e)
(Continued)

annealing the doping reduction layer, wherein step d) and e) are performed such that the doping concentration of the drift layer is reduced in the doping reduction layer.

20 Claims, 9 Drawing Sheets

(51) Int. Cl.
    *H01L 29/16*     (2006.01)
    *H01L 29/66*     (2006.01)
    *H01L 29/739*     (2006.01)
    *H01L 29/06*     (2006.01)
    *H01L 29/868*     (2006.01)

(52) U.S. Cl.
    CPC ...... *H01L 29/6606* (2013.01); *H01L 29/7395* (2013.01); *H01L 29/868* (2013.01)

(56) References Cited

U.S. PATENT DOCUMENTS

| | | | |
|---|---|---|---|
| 2002/0045321 | A1 | 4/2002 | Galster et al. |
| 2008/0132048 | A1 | 6/2008 | Barthelmess et al. |
| 2014/0021489 | A1 | 1/2014 | Hamada et al. |
| 2014/0151858 | A1 | 6/2014 | Schulze et al. |
| 2014/0291695 | A1 | 10/2014 | Schulze et al. |
| 2014/0302667 | A1 | 10/2014 | Schulze et al. |
| 2014/0374774 | A1 | 12/2014 | Tanaka et al. |
| 2016/0027867 | A1* | 1/2016 | Matsushita ......... H01L 29/7395 257/140 |

OTHER PUBLICATIONS

European Patent Office, Extended Search Report issued in corresponding Application No. 15171208.0, dated Nov. 26, 2015, 9 pp.

Hazdra et al., "Radiation defects produced in 4H-SiC epilayers by proton and alpha-particle irradiation," Materials Science Forum, vols. 740-742 (2013), pp. 661-664.

Lebedev et al., "Doping of n-type 6H-SiC and 4H-SiC with defects created a proton beam," Journal of Applied Physics, vol. 88, No. 11, Dec. 1, 2000, pp. 6265-6271.

Perez et al., "Planar Edge Termination Design and Technology Considerations for 1.7-kV 4H-SiC PiN Diodes," IEEE Transactions on Electron Devices, vol. 52, No. 10, Oct. 2005, pp. 2309-2316.

Vobecky et al., "On-state characteristics of proton irradiated 4H-SiC Schottky diode: The calibration of model parameters for device simulation," Solid-State Electronics, vol. 94 (2014), pp. 32-38.

* cited by examiner

METHOD FOR MANUFACTURING AN EDGE TERMINATION FOR A SILICON CARBIDE POWER SEMICONDUCTOR DEVICE

TECHNICAL FIELD

The invention relates to the field of power electronics and more particularly to a method for manufacturing an edge termination structure for a silicon carbide power semiconductor device, to a method to manufacture a silicon carbide power semiconductor device having such an edge termination structure and to a silicon carbide power semiconductor device as such.

BACKGROUND ART

A conventional silicon carbide (SiC) Schottky diode comprises an n-type SiC substrate, on which an n− doped drift layer is epitaxially grown. This drift layer is contacted by a Schottky contact. Surrounding the Schottky contact a p doped junction termination extension (JTE) layer may be arranged in order to lower the electric field peak on the edge of the Schottky contact and to smoothly lower the electric field towards the edge of the diode. Additionally to the JTE layer, concentric floating p doped guard rings may be around the JTE layer to avoid high field peaks on the surface of the Schottky diode in the termination region.

In WO 2009/108268 A1 a prior art silicon carbide Schottky diode is described, which has an edge termination structure with a plurality of spaced apart concentric floating guard rings, which are p doped. Each of the guard rings comprises a highly doped portion and a lightly doped portion. Such a diode needs multiple ion implantation for the forming of the higher and lower doped portions. Different masks have to be applied and typically, different ions are used to create the different doping concentrations and preferably also different diffusion depths. This makes the manufacturing costly. At the same time, it increases demands on the alignment precision and reproducibility of lithographical processing steps and/or it reduces production yield. Due to the misalignment of highly and lightly doped p-regions in production, the enhancement of the blocking voltage might not be as high as predicted by the device simulation.

"Radiation Produced in 4H—SiC Epilayers by Alpha-Particle Irradiation", Materials Science Forum, vol. 740-742, 2013, 661-664, concerns a prior art method for the creation of a lower doped layer in an n-doped 4H—SiC epi layer for a diode created by a single irradiation with 550 keV protons.

US 2014/374774 A1 describes a method for creating an (n−−) lowly doped layer between an (n−) doped drift layer and an (n+) doped layer. All layers are created by epitaxial growth. The doping reduction layer overlaps with p doped termination layers in form of p guard rings, i.e. the doping reduction layer is shallower than the guard rings.

DISCLOSURE OF INVENTION

It is an object of the invention to provide a method for manufacturing an edge termination for a power silicon carbide semiconductor device which is easy to manufacture and efficiently prevents or at least lowers any electric field peaks in the termination region, thereby improving the breakdown properties of the device.

This object is achieved by a method for manufacturing an edge termination for a power silicon carbide semiconductor device according to claim 1, a method for manufacturing a silicon carbide power semiconductor device comprising such an edge termination structure according to claim 11 and a silicon carbide power semiconductor device comprising such an edge termination structure according to claim 12.

Due to the lowering of the doping concentration of the drift layer in the (n−−) doping reduction layer, the electric field peaks can be lowered in the edge region and thus, also the electric field distribution towards the edge of the device may be smoothed. Due to the low doping concentration in the doping reduction layer, no high electric fields extend to the surface of the device in the termination (edge) region. By such doping reduction layers the breakdown voltage of the device may be increased and the reverse current resulting from impact ionization at junction termination is lowered. A lower leakage current again, enables the device to be operated with enhanced blocking stability. The doping reduction layer can be implemented in combination with known termination means for lowering the electric field in the edge region such as p doped guard rings, junction termination extensions or floating metal rings (also called field plates), not excluding other known means.

The implantation of light ions (helium or hydrogen (protons)) to compensate the original concentration of the drift layer by introduced radiation point defects, thereby creating a doping reduction layer, may be restricted to the edge region. This results in a device, in which the termination region has a higher breakdown voltage than the active bulk region, so that the device blocking stability may be enhanced in the inventive device. In case of biasing the device above the breakdown voltage, the lower breakdown voltage in the bulk functions like a protection of the edge termination, which prevents the wear-out of junction termination surface passivation (the most sensitive part of device from reliability viewpoint) and increases reliability.

Helium or hydrogen (protons) is applied as a first ion to compensate the original doping concentration of the drift layer. Such light ions can be introduced into higher depths than heavier ions at the same implant energy. Both ions have the advantage that they are stopped in silicon carbide in a small depth range of less than 1 μm so that locally limited layers (in depth direction) may be created. Thereby, it is possible to protect the places of highest electric fields particularly.

Furthermore, ion implanters for light ions and low dose such as helium and hydrogen are available at commercial accelerators and lower implantation energies may be chosen to implant the ions into the desired depth.

Depending on the application, a single or multiple ion peaks with different energies can further enhance the breakdown voltage without increasing the leakage current.

Further preferred embodiments of the inventive subject matter are disclosed in the dependent claims.

BRIEF DESCRIPTION OF DRAWINGS

The subject matter of the invention will be explained in more detail in the following text with reference to the attached drawings, in which:

The FIGS. 1 to 8 and 16 show cross sectional views on inventive SiC Junction Barrier Schottky diodes or merged PiN Schottky diode.

The FIGS. 9 to 15 show cross sectional views on inventive SiC Schottky diodes.

In the FIGS. 1 to 4 and 9 to 11 and 16 the doping reduction layer is restricted to the edge region, i.e. no such layer is arranged in the central (active) region, whereas in the FIGS.

5 to 8 and 12 to 15 the doping reduction layer is a continuous layer extending throughout the active and edge region.

The FIGS. 1, 5, 9, 12 and 16 show floating metal rings in the edge region.

FIGS. 2, 6, 10 and 13 show inventive devices having p doped guard rings in the edge region.

Figure 4:
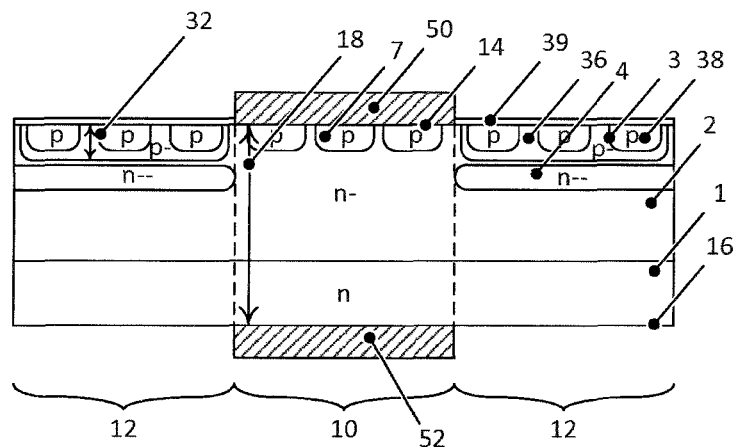
Figure 5:
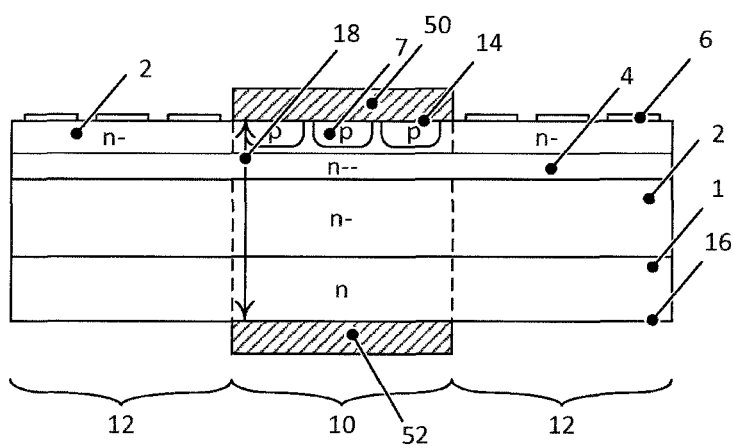
Figure 6:
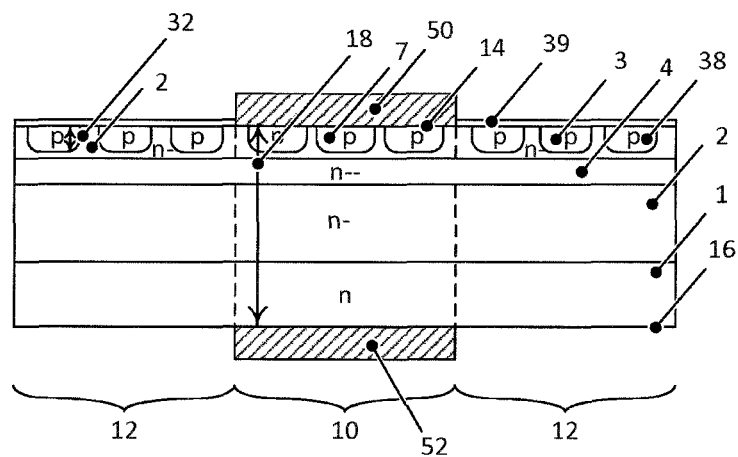
Figure 7:
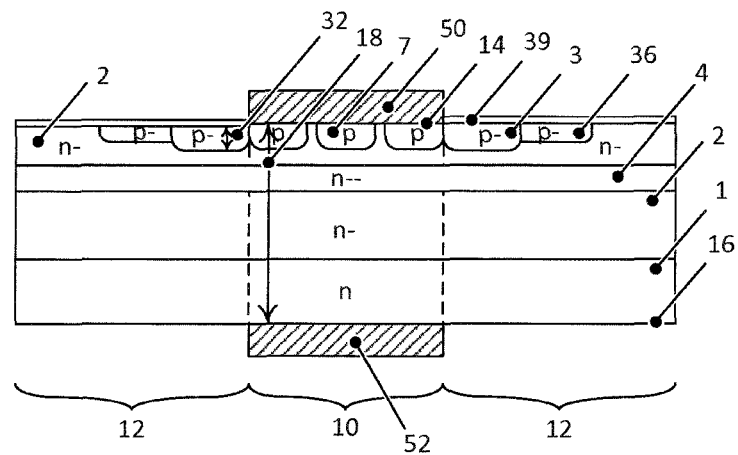
Figure 8:
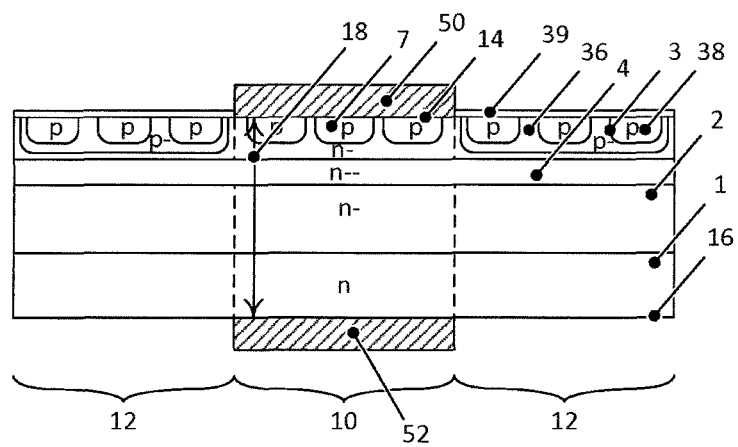
Figure 15:
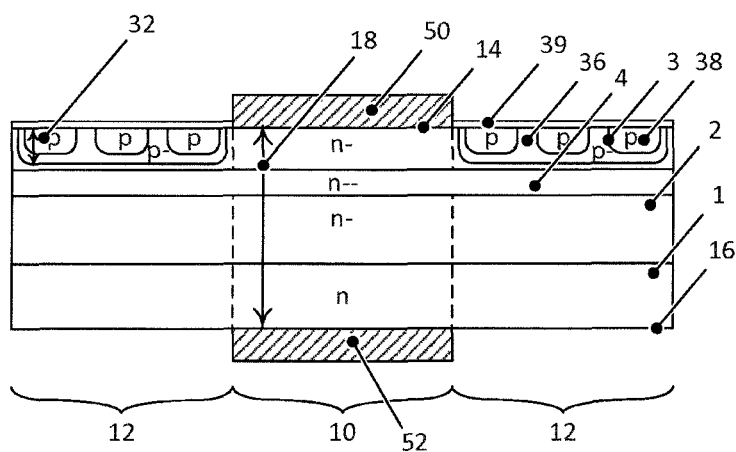

FIGS. 3, 7, 11 and 14 show inventive devices having junction termination extensions as p doped termination layers, whereas the FIGS. 4, 8 and 15 show a combination of p doped guard rings with embedded in junction termination extensions.

Figure 16:
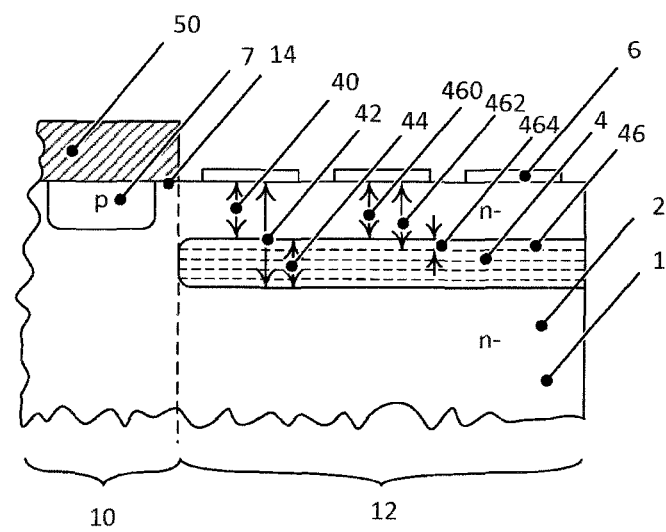

FIG. 16 further shows an doping reduction layer comprising five doping reduction regions.

The FIGS. 17 to 20 shows steps of a method for manufacturing an inventive silicon carbide power semiconductor device.

Figure 21:
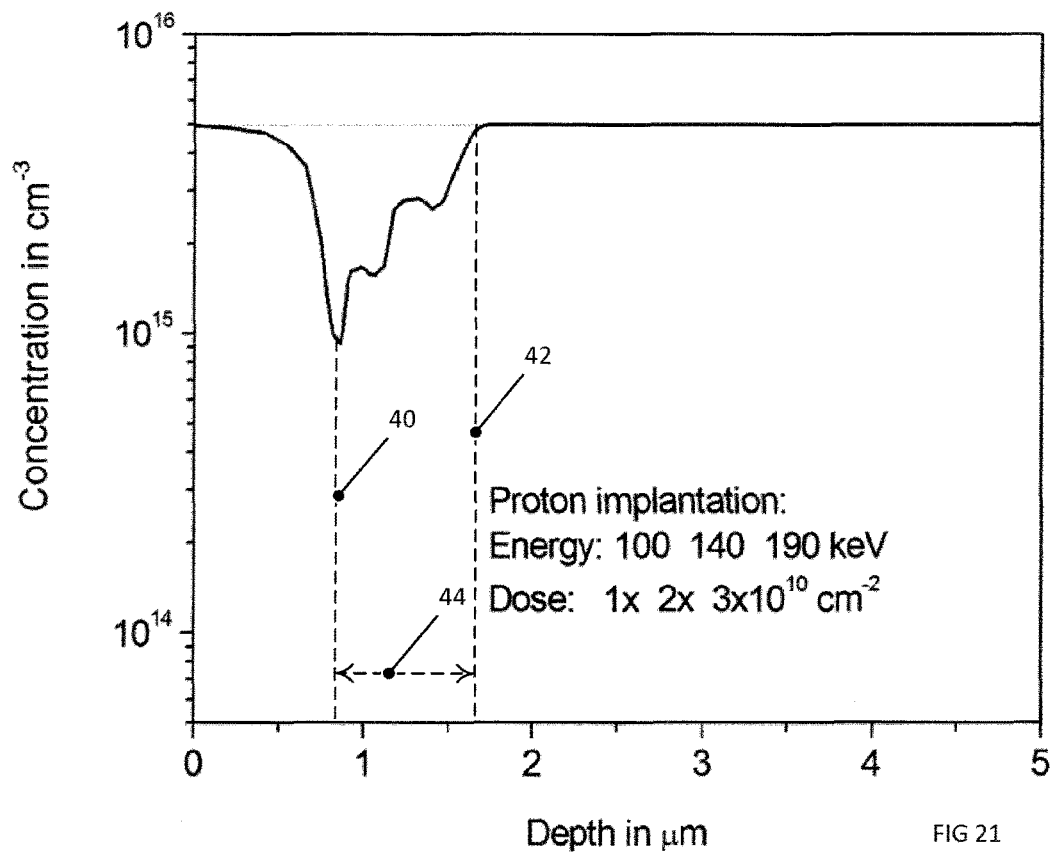

FIG. 21 shows an inventive Schottky diode having a shallow doping reduction layer made with three different implantation energies.

Figure 22:
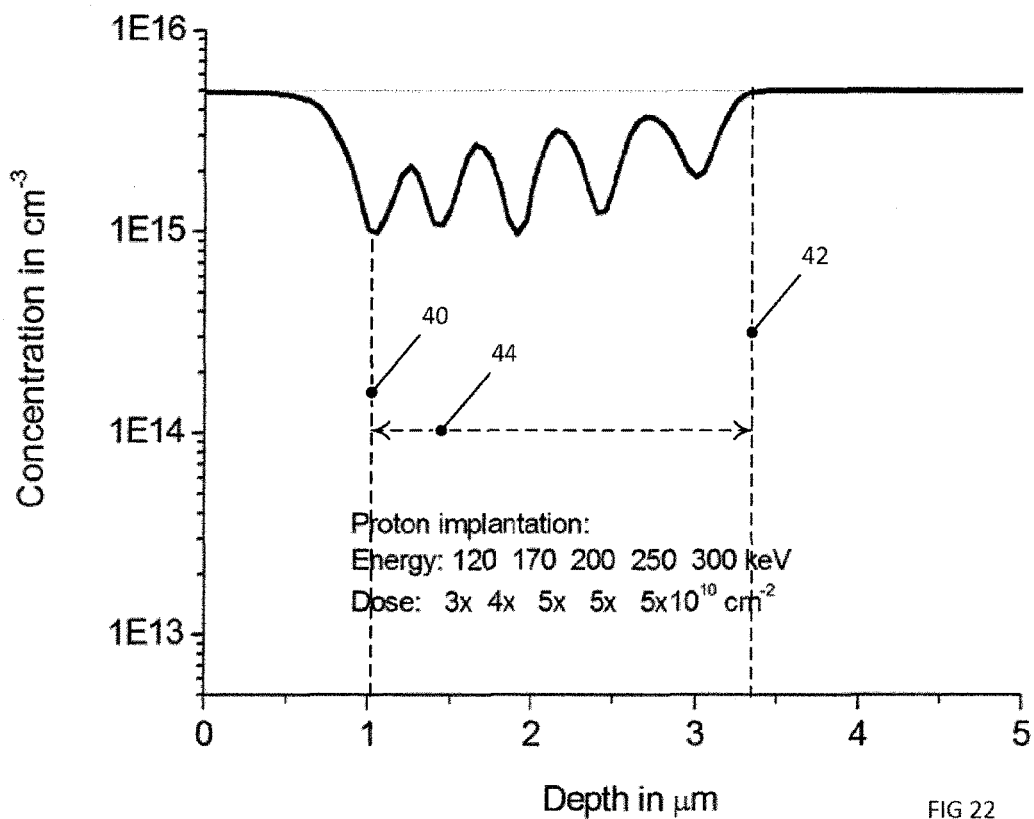

FIG. 22 shows an inventive Schottky diode having a shallow doping reduction layer made with five different implantation energies.

Figure 23:
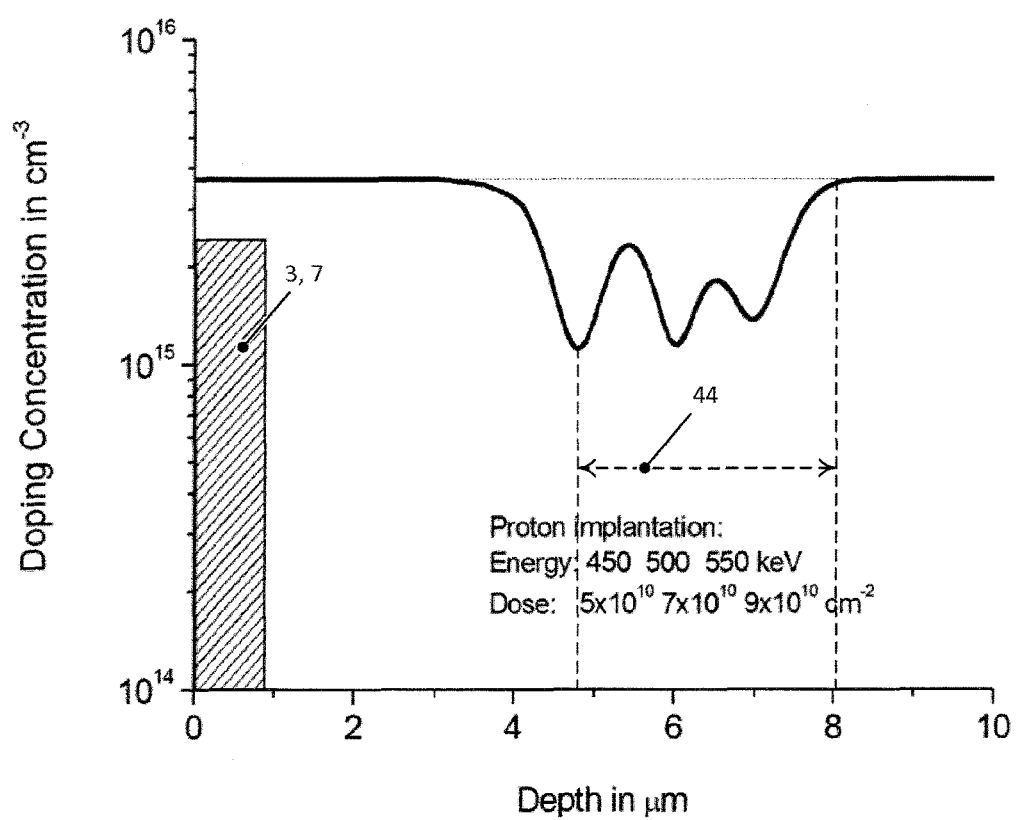

FIG. 23 shows an inventive JBS diode having a deep doping reduction layer made with three different implantation energies.

The reference symbols used in the figures and their meaning are summarized in the list of reference symbols. Generally, alike or alike-functioning parts are given the same reference symbols. The described embodiments are meant as examples and shall not confine the invention.

MODES FOR CARRYING OUT THE INVENTION

FIGS. 1 to 8 and 16 show an inventive silicon carbide power semiconductor device in form of a Junction Barrier Schottky (JBS) diode or a merged PiN Schottky (MPS) diode having a central region 10 and an edge region 12 (termination region) between a first main side 14 and a second main side 16 opposite to the first main side 14. An n doped silicon carbide substrate layer 1 is arranged on the second main side 16. An n− doped silicon carbide drift layer 2 which is lower doped than the n doped SiC substrate 1, is arranged on the first main side 14.

In the edge region 10 an (n−−) doped doping reduction layer 4 is arranged, which has a lower doping concentration than the drift layer 2, wherein the doping reduction layer 4 is arranged in a layer depth range 44 between a doping concentration minimum 40 below the first main side 14 up to a maximum doping reduction layer depth 42. This maximum depth 42 is lower than the thickness of the power semiconductor device. The doping concentration minimum 40 of the doping reduction layer 4 is located below the surface (first main side 14) of the power semiconductor device. The doping reduction layer depth range 44 is less than 10 µm or less than 5 µm. A doping reduction region depth range 44 is the deviation between the minimum doping concentration and the maximum doping reduction layer depth 40, 42.

The JBS diode (FIGS. 1 to 8 and 16) comprises on the first main side 14 in the central region 10 a p doped anode layer 7 (or a plurality of such anode layers 7). In the central region 10, the anode layer 7 contacts a metal electrode 50, which is an anode electrode for the JBS diode. On the cathode side (second main side 16) the n doped substrate 1 functions as a cathode layer which contacts a metal electrode 52 in the central region 10, which metal electrode 52 is a cathode electrode for the JBS diode. Metal electrode 52 forms ohmic contact to the silicon carbide layers, i.e. to the n doped cathode layer (substrate 1). Metal electrode 50 forms ohmic contact to the silicon carbide p doped anode layer 7 and Schottky contact to the silicon carbide layer 2, if the p doped anode layer is formed by the plurality of the p anode layers.

In the FIGS. 1 to 4, 9 to 11 and 16, the doping reduction layer 4 is a continuous layer in the edge region 12 extending throughout a plane parallel to the first main side 14, whereas in these embodiments, no doping reduction layer is arranged in the central region 10.

In FIGS. 1, 5, 9, 12 and 16 the edge region 12 is covered by floating metal rings 6, which are closed rings enclosing each other and enclosing the central region 10. These floating metal rings 6 are floating (are not electrically contacted) and, thus, reduce the electric field towards the edge of the device.

The FIGS. 2, 3, 6, 7, 8, 10, 11, 13 to 15 show inventive devices, in which at least one p doped termination layer 3 is arranged in the edge region 10 on the first main side 14.

In the FIGS. 2, 6, 10 and 13 the at least one termination layer 3 is formed as at least one floating (not electrically contacted) layer, which may also be called guard ring 38. Each guard ring 38 is a closed-in-itself layer (ring) which surrounds the central region 10. One or more of such guard rings 38 (e.g. at least two or at least five or at least ten guard rings 38), may be arranged around the central region 10, wherein the guard rings 38 surround each other and are spaced apart by the drift layer 2. Exemplarily, at least two or at least five or at least ten p doped termination layers 3 may be formed as guard rings 38. Depending on the voltage class of the device, more than twenty such guard rings 38 may be arranged in the edge region 12. The guard rings 38 may be covered by a passivation 39 (exemplarily semi-insulating).

In the FIGS. 3, 7, 11 and 14 inventive devices are shown, in which the at least one p doped termination layer 3 is designed as a junction termination extension (JTE) 36, which is a p doped layer lower doped than the p type anode layer 7 in the central region 10 (electrically active region), for an inventive device having such an anode layer 7. "Lower doped" shall refer to the maximum doping concentration which is lower than the maximum doping concentration for the layer in comparison. The JTE layer 36 and the p doped anode layer 7 in the central region 10 may be connected to each other. The JTE 36 may comprise a plurality of lowly p− doped layers, which may be connected to each other (in FIG. 3 two such layers are shown, wherein the outer layer has a lower depth and exemplarily also a lower doping concentration than the layer directed towards the central region 10). These layers may be doped such that in direction of the central region 10, the JTE layer 36 is higher doped than such JTE being arranged farer away from the central region 10. The doping concentration of the JTE 36 (i.e. the maximum doping concentration in depth direction) may thus decrease towards the edge of the device. Additionally, the depths of such JTE 36 may also be successively lowered towards the edge of the device.

The FIGS. 4, 8 and 15 show another embodiment of the inventive device, in which at least one p doped guard ring 38 and a p− doped, i.e. lower doped JTE 36 are arranged together in a device. The JTE 36 and guard ring(s) 38 may overlap, e.g. the guard ring(s) 38 may be embedded in the JTE 36 such that the guard rings 38 are separated from the drift layer 2 by the JTE 36. Thus, the guard rings 38 have a shallower maximum depth than the at least one JTE 36. In these figures, there is one JTE 36 arranged in the edge region 12, but it is also possible that a plurality of such JTE 36 like in the FIGS. 3, 7, 11 and 14 are overlapping with the guard rings 38.

In the FIGS. 1 to 4, 9 to 11 and 16, the doping reduction layer 4 is limited to a region in the edge region 12. Alternatively, it is also possible to have the doping reduction layer 4 extending throughout a plane parallel to the first main side 14 in the central and edge region 10, 12. For these devices the breakdown voltage is increased in the edge region 12 as well as in the central region 10.

In the edge region, any means or combination of means well known to the experts in the field for reducing the electric field towards the edge of the device may be used.

Exemplarily, the drift layer 2 has a constantly low doping concentration. Therein, the substantially constant doping concentration of the drift layer 2 means that the doping concentration is substantially homogeneous throughout the drift layer 2, however without excluding that fluctuations in the doping concentration within the drift layer being in the order of a factor of one to five may be possibly present due to e.g. a fluctuations in the epitaxial growth process or intentionally locally modified doping concentration, where a typical example is the thin buffer layer between the highly doped n substrate layer 1 and low-doped n epitaxial (drift) layer 2 to improve switching behaviour.

The doping reduction layer 4 has a doping concentration, which is lower than the doping concentration of the drift layer 2. The doping concentration in the doping reduction layer 4 may be between 25 to 75% or at between 40 to 75% of the doping concentration of the drift layer 2.

For the Schottky diode, the doping reduction layer 4 is located at least 0.5 µm below the anode surface and can extend up to less than one half of the n drift layer thickness.

For the JBS and MPS diodes, the doping reduction layer 4 is located below the p-n junction formed by the anode p layer 7 and n drift layer 2. For SiC implanted p anode layers 7, it implies an exemplary distance more than 1 µm below the anode surface. An exemplary placement of the doping reduction layer 4 is given by the most efficient reduction of electric field at reverse blocking and can be found by device simulation, which shows that it has to be shallow (measured from the anode surface) relatively to the thickness of the n drift layer 2. This is summarized for both Schottky and JBS (MPS) diodes and various voltage classes in the table below.

which is about ⅓ of the drift layer thickness±1 µm). In case that a multiple hydrogen or helium implantation energy is used, the range between the distances 40 and 42 from the table may be more intensively utilized for the doping reduction hereby achieving a higher improvement of breakdown voltage.

For the JBS and MPS diodes and/or junction termination 3 using the p type guard rings 38 or JTE 36, the doping reduction layer 4 is advantageously arranged below the anode layer 7 or JTE 36 or guard ring 38. Also for the Schottky diode, the placement of the doping reduction layer is advantageously below the p type junction termination 3 (see FIG. 10, 11) and not at the anode surface in order to avoid a high concentration of point defects at the Schottky contact, which might enhance non-homogeneity of the barrier height.

Contrary to the prior art U.S. Pat. No. 5,914,499, where the original SiC semiconductor material must be implanted by extremely high doses using multiple energies to become an insulator in a whole volume of junction termination, the doping reduction in this invention is chosen in the range of 25-75% of the doping concentration of the surrounding n-drift layer. As a result, the cost of implantation drops significantly and the whole process becomes economically feasible.

The depths of the layers shall be measured from the first main side 14. The minimum depth 40 of the doping reduction layer 4 shall be the depth of the shallowest doping concentration minimum of the doping reduction layer 4, which is the lowest doping concentration minimum of the layer (in case the layer comprises a plurality of doping reduction regions, i.e. overlapping regions, all of which have a local doping concentration minimum). The maximum depth 42 of a layer shall be such depth from the first main side 14, at which the layer is present, i.e. the depth, at which the doping concentration reaches again the original doping concentration of the drift layer 2. The layer depth range shall be the deviation of the maximum depth and the doping concentration minimum, i.e. it is the thickness of layer. Thus, the doping concentration layer 4 has the same conductivity type as the drift layer 2 (i.e. n type) and it is defined by its lower doping concentration than the drift layer 2.

Figure 1:
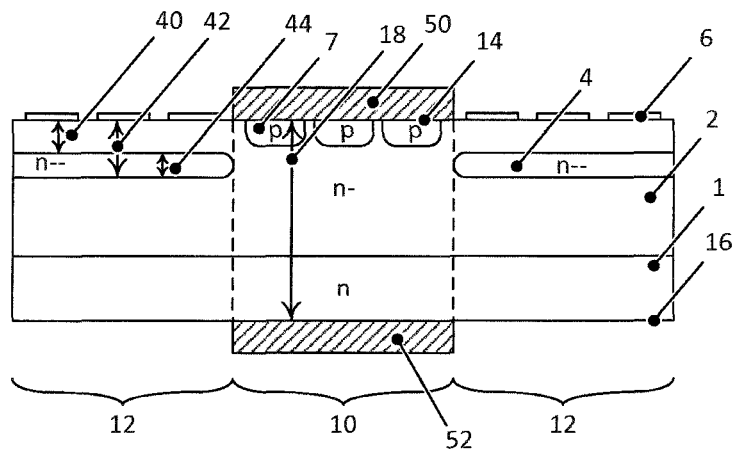
Figure 2:
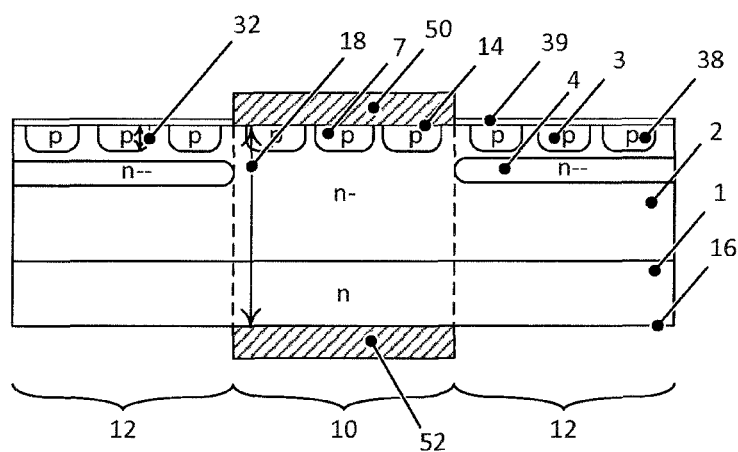
Figure 3:
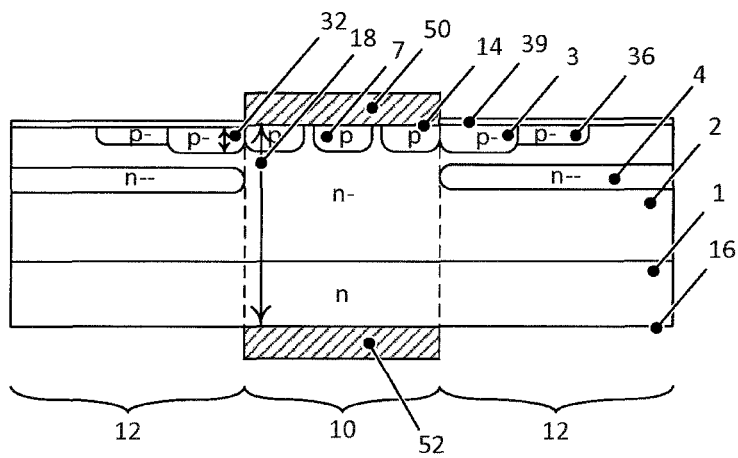

In FIG. 16 a detail of FIG. 1 is shown. The doping reduction layer 4 comprises a plurality of doping reduction

| Breakdown voltage (kV) | Exemplary doping concentration of drift layer 2 (cm$^{-3}$) | Thickness of drift layer 2 (µm) | doping reduction layer depth range 44 leading to the increase of breakdown voltage (µm) (i.e. depth of dop. conc. minimum 40 to maximum depth 42) |
|---|---|---|---|
| 1.2 | $5.10^{15}$ | 13 | 2/7 |
| 1.7 | $4.10^{15}$ | 20 | 2/12 |
| 3.3 | $3.10^{15}$ | 30 | 2/17 |
| 10 | $7.10^{14}$ | 100 | 2/40 |

The table shows exemplary design parameters for Schottky and JBS diodes. The depth of p-n junction between the n drift layer 2 and p anode layer 7 or p guard ring 38 or p-type JTE layer 36 at junction termination is considered to be below 1 µm. For a deeper placement of this p-n junction, the doping concentration minimum 40 of the doping reduction layer 4 has to be increased accordingly.

In case that a single hydrogen or helium implantation energy is used for the doping reduction, the optimal ion range appears at about ⅔ of the maximum doping reduction layer depth 42 in the table above considering the doping reduction layer depth range 44 at about 0.5 µm (⅔±1 µm, regions 46 (in FIG. 16 there are 5 such regions 46 shown indicated by the dashed lines), each of which has a depth of the doping concentration minimum of the doping reduction region 460, a maximum doping reduction region depth 462 and a doping reduction region depth range 464 being the deviation between the maximum doping reduction region depth 462 and the depth of the doping concentration minimum 460. Each doping reduction region depth range 464 is less than 1 µm or less than 0.6 µm or between 0.2 to 0.5 µm.

In FIG. 16 the doping reduction regions 46 overlap or at least are in touch with each other. By having such touching or overlapping doping reduction regions 46 a contiguous doping reduction layer 4 is created, which has a greater thickness than a layer achievable with the applied energies for application of the first ion.

For an inventive device comprising a termination layer 3, the doping reduction layer 4 may have a depth of a minimum doping concentration of the doping reduction layer 40, which is greater than the maximum termination layer depth 32 so that the doping reduction layer 4 is completely embedded in (i.e. surrounded by) the drift layer 2. Alternatively, the depth of the doping concentration minimum 40 of the doping reduction layer 4 may be shallower than the maximum depth 32 of the p doped termination layer 3, i.e. doping reduction layer 4 and termination layer may touch each other. The doping reduction layer 4 may have a maximum depth, which is deeper than the depth of the p doped termination layer 3.

In an exemplary embodiment, for a device comprising a termination layer 3, the doping reduction layer 4 is located below the p-n junction (i.e. the doping reduction layer 4 is embedded in the drift layer 2), e.g. some μm below the junction, exemplarily between 4 to 6 μm from surface at 1.7 kV device from Tab.1. The doping reduction layer 4 flattens the originally triangular electric field distribution and decreases this field below the critical field value for enhanced impact generation rate, thus reducing the electric field and subsequently improving the breakdown voltage.

In the FIGS. 17 to 20 a method for manufacturing an edge termination for a silicon carbide power semiconductor device is shown. The device has a central region 10 and an edge region 12 between a first main side 14 and a second main side 16 opposite to the first main side 14.

Figure 17:
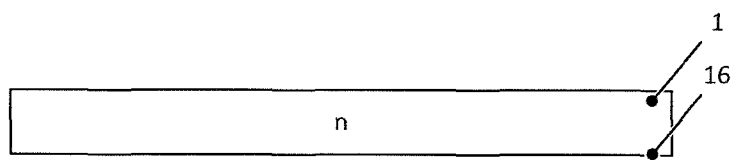

In step a) of the manufacturing method as shown in FIG. 17, an n doped silicon carbide substrate 1 is provided having two sides opposite to each other, wherein one side is the second main side 16.

Figure 18:
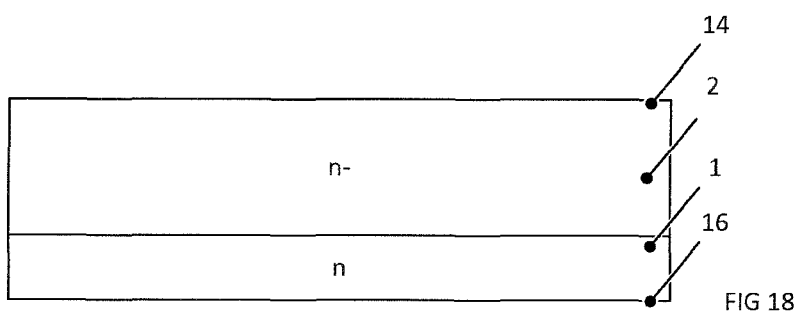

In step b) on the side opposite to the second main side 16 of the substrate an n-doped drift layer 2 is epitaxially grown (FIG. 18). The drift layer 2 has a lower doping concentration than the substrate 1. The side of the drift layer 2 opposite to the substrate 1 forms the first main side 14. Exemplarily, the drift layer 2 has a constant low doping concentration. Optionally, there can be an n doped buffer layer arranged between the substrate 1 and n– doped drift layer 2, which buffer layer is exemplarily epitaxially grown. The buffer layer has a doping concentration higher than the drift layer 2 and lower than the substrate 1.

For a device comprising a p doped layer on the first main side 14 (i.e. anode layer 7 or termination layer 3) the p anode layer 7 may be formed together with the p layers for junction termination 3 according to design needs. Optionally, the p anode layer 7 can be formed separately from that of the junction termination layer 3 to utilize the advantage of different p type ions and implantation energies for device performance. The forming means both the implantation and high temperature annealing steps (e.g. at 1600° C.). In step c) any p type layer 3, 7 at the anode side 14 is formed prior to the processing of the doping reduction layer 4, i.e. before step d). This is because the p type layers 3, 7 require a high temperature annealing contrary to the inventive doping reduction layers 4, which are exemplarily annealed at temperatures above 320° C. and are temperature stable up to about 1200° C.

Figure 19:
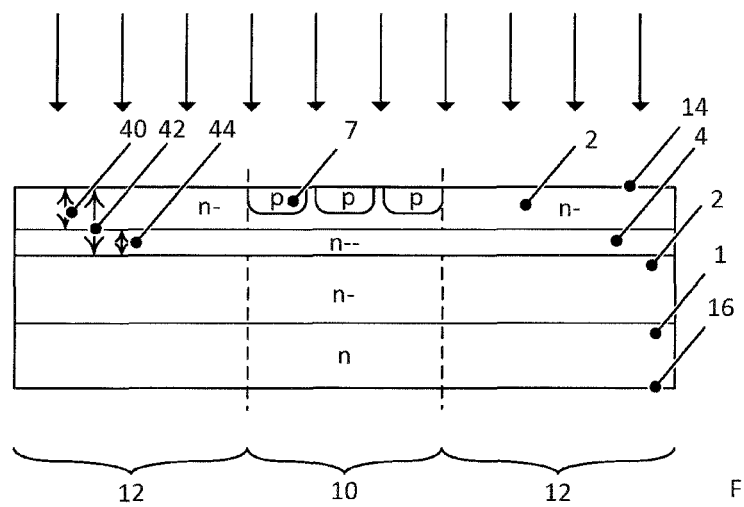
Figure 20:
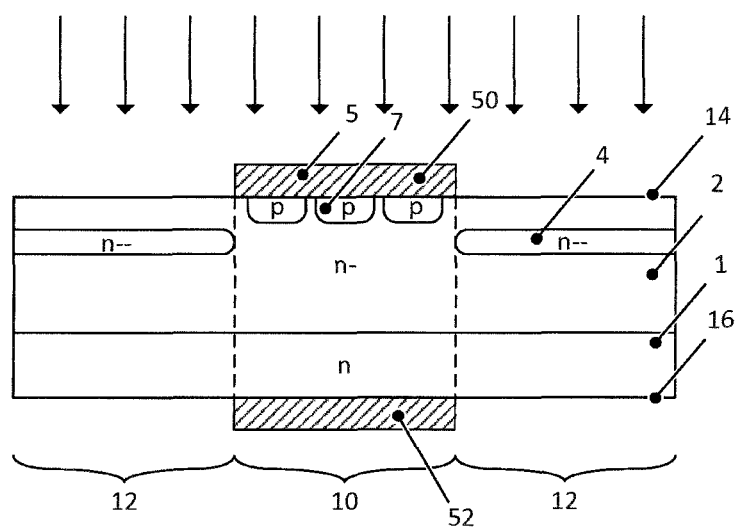

In step d) after the optional creation of the p doped layers 3, 7 a doping reduction layer 4 is formed on the first main side 14 having a layer depth range 44 between a depth of a doping concentration minimum 40 of the doping reduction layer 4 (i.e. shallowest doping concentration minimum) below the first main side 14 up to a maximum doping reduction layer depth 42. The doping reduction layer 4 comprises at least one doping reduction region 46, wherein for the creation of each doping reduction region 46 a first ion is implanted with an implantation energy on the first main side 14 at least in the edge region 12 (see FIG. 16 showing a plurality of, i.e. five doping reduction regions 46 indicated by dashed lines). FIG. 19 shows an implantation over the whole first main side 14 (indicated by the arrows) so that a doping reduction layer 4 is formed throughout the whole plane parallel to the first main side 14. The first ion is implanted in a doping reduction region depth range 464 between a depth of the doping concentration minimum 460 below the first main side 14 up to a maximum doping reduction region depth 462. Exemplarily, the shallowest of all minimum doping reduction region depths 460 corresponds to the absolute doping concentration minimum 40 of the doping reduction layer 4, whereas the deepest maximum doping reduction region depth 462 corresponds to the maximum doping reduction layer depth 42.

The first ion and the at least one implantation energy are chosen such that the doping reduction layer depth range 44 is less than 10 μm. For one implantation energy, the depth range 44 is 0.5-0.7 μm depending on chosen energy. With increasing energy, the depth range is growing while doping reduction decreases (broadening of defect peak with increasing energy). For five implantation energies as shown in FIG. 16, the depth range 44 is in the range 2-5 μm according to the chosen energies. Various implantation schemes with more than five implantation energies can be optimized according to required improvement in blocking capability and n-drift layer thickness.

Depending on the design of the device, it may be desirable to cover the central region on the first main side 14 with a mask 5 (FIG. 20) in order to avoid the implant of the first ion into the central region in step d). The first ion is then applied only in the edge region 12. As a mask 5, a metal contact/electrode 50 which may function in the finalized device as a main electrode, may be applied. Before implanting the first ion, the mask 5 may be applied on the first main side 14, which covers the central region 10 and thus, prevents the first ion from being implanted in the central region 10. A metal electrode 50, which functions as main electrode for the device, may also be used as a mask.

Figure 9:
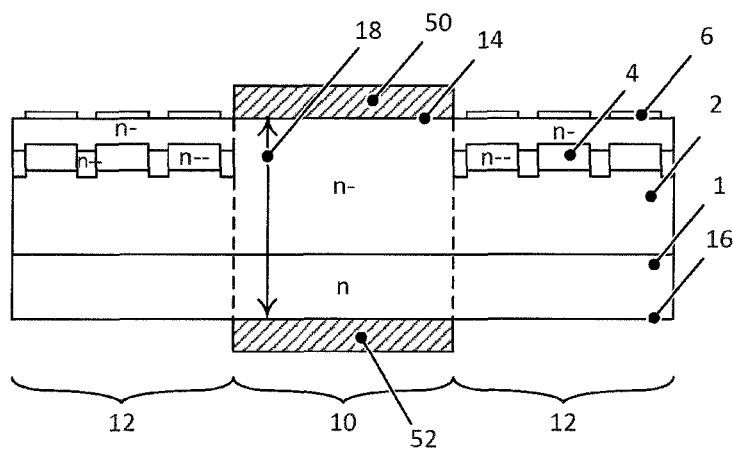
Figure 10:
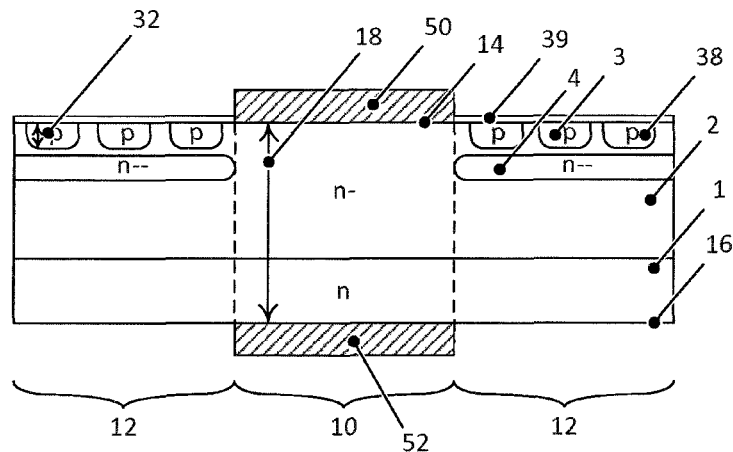
Figure 11:
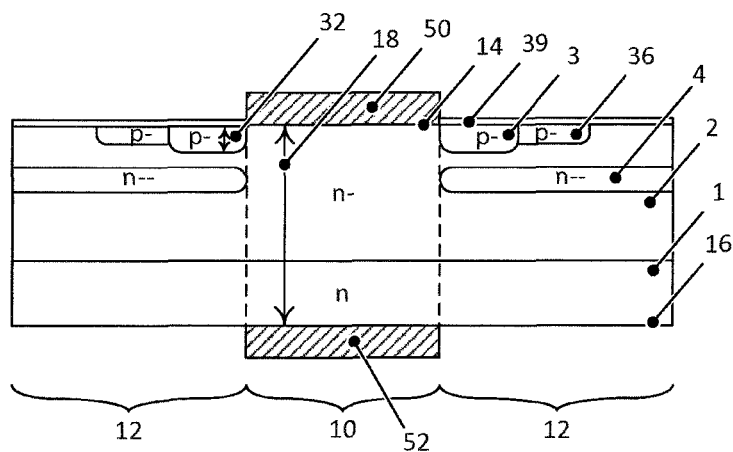
Figure 12:
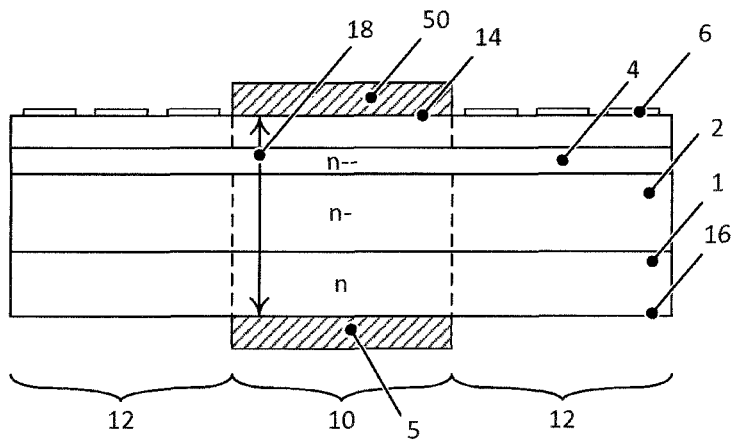
Figure 13:
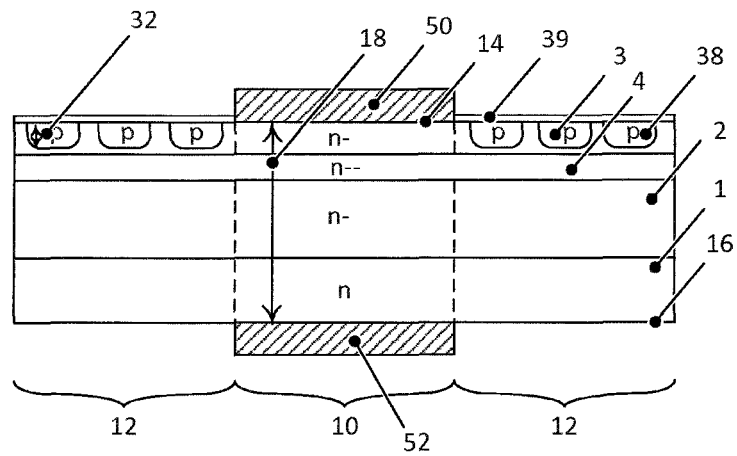
Figure 14:
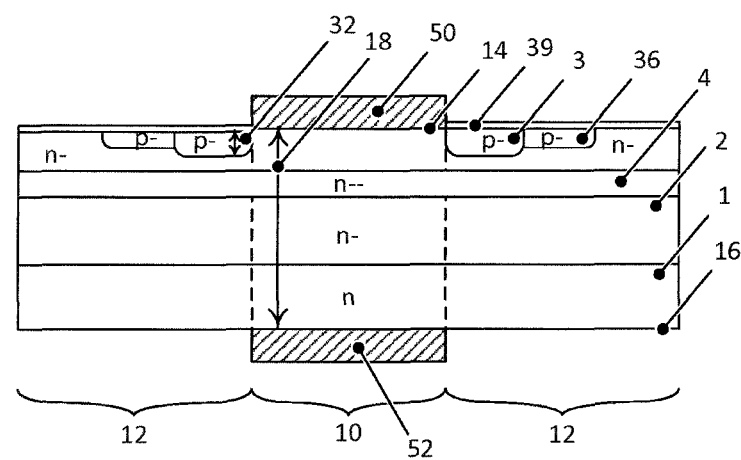

For a device comprising floating metal rings 6, the floating metal rings 6 may also be applied before the implantation of the first ion, so that they also act as a mask. Depending on the thickness of the floating metal rings, the first ion may not be completely stopped in the floating metal rings 6, so that this can lead to a variation of the implantation energy and thus, the first ion is implanted in lower depths than in the area, which are not covered with a floating metal ring (FIG. 9). A doping reduction layer pattern is thereby created having deeper lying portions below the areas which are not covered by a floating metal ring 6 and shallower lying portions below the areas which are covered by the floating metal rings 6. Thus, the pattern has the same closed ring structure as the floating metal rings 6.

Alternatively, no mask is applied and the first ion is applied over the whole surface on the first main side 14 resulting in a continuous doping reduction layer 4, which extends over the whole plane of the device (parallel to the first mains side 14). In this case, a metal electrode 50 may be applied later on the central region 10 on the first main side 14.

Another metal electrode 52 may be applied on the second main side 16 at any appropriate manufacturing step, e.g.

together with the metal electrode 50, but it is also possible to create the metal electrodes 50, 52 separately.

Exemplarily hydrogen or helium or another light ion is applied as a first ion on the first main side 14 with at least one implantation energy. The ion is implanted up to a maximum depth 462 being lower than the thickness of the semi-fabricated power semiconductor device after step b). The term "semi-fabricated device" shall refer to the not finalized semiconductor device at a step of manufacturing, after step b) to the combined thickness of the substrate 1 and the drift layer 2.

By the ion implantation and subsequent annealing Z1/Z2 centers are created in the silicon carbide material, which Z1/Z2 centers are double-acceptor levels of carbon vacancy. Then, in step e) the doping reduction layer 4 is annealed such that the Z1/Z2 centers are thermally stabilized. The annealing may be performed at a temperature above 320° C. or above 350° C. By these steps d) and e) the doping concentration of the drift layer 2 is reduced in the doping reduction layer 4. Depending on the implant dose, and thereby on the numbers of Z1/Z2 centers, the doping concentration in the drift layer 2 (i.e. in the doping reduction layer 4) may be lowered to a value, which is exemplarily between 25 to 75% or between 40 to 75% of the doping concentration of the drift layer 2. Such Z1/Z2 centers are carbon vacancies, which are created in any kind of silicon carbide. Exemplarily, the silicon carbide is a polytype or a polymorph type like amorphous silicon carbide.

As Z1/Z2 centers may be removed by annealing at 1200° C. and higher, metallization for the creation of the metal electrodes 50 and/or 52 may be performed after proton or helium implantation (i.e. step d)), if the metal sintering temperature is performed below 1200° C.

In an exemplary embodiment, in step d) a plurality of doping reduction regions 46, each of which having a different minimum and maximum reduction region depth 460, 462, may be formed by implanting the first ion with different implantation energies. Exemplarily, at least two or three to ten or three to six different implantation energies may be applied. By applying different implant energies, the first ion is implanted into different depths. Each doping reduction region 46 may have a doping reduction region depth range, i.e. a thickness, which is less than 1 µm or less than 0.6 µm or between 0.2 to 0.5 µm. Doping reduction regions 46 may be created, which overlap or at least touch each other such that they form a continuous doping reduction layer 4. Thereby, a doping reduction layer 4 depth range may be formed greater than achievable for a layer made with one implantation energy.

For the ion being hydrogen, it may be implanted with an implantation energy between 150 to 1000 keV or 300 to 800 keV for a device comprising a p doped layer 3, 7. The implant dose for hydrogen may exemplarily be chosen between $5*10^9$ cm$^{-2}$ to $1*10^{14}$ cm$^{-2}$ or $1*10^{10}$ cm$^{-2}$ to $1*10^{13}$ cm$^{-2}$. If more than one implant is made, each implant may have an individual dose and energy. For a device having no p doped layer 3, 7 on the first main side 14, lower implantation energies may be applied, exemplarily between 100 to 1000 keV or between 150 to 500 keV and implantation doses between $2*10^9$ cm$^{-2}$ to $1*10^{14}$ cm$^{-2}$ or $5*10^9$ cm$^{-2}$ to $1*10^{13}$ cm$^{-2}$.

FIG. 21 and FIG. 22 show exemplarily the doping profile after hydrogen implantation with 3 and 5 different hydrogen energies for a Schottky diode having no p layer on the first main side 14. In FIG. 21, for the three implants, the energies vary from 100 keV to 190 keV (FIG. 21), and in FIG. 22 for the five different implants, the energies vary between 120 and 300 keV. In the first case, the protons are implanted into a maximum depth 42 of 1.7 µm, whereas in the second case the protons are implanted into a maximum depth 42 of about 3.3 µm. In FIG. 21, the depth of doping concentration minimum of the doping reduction layer 40, i.e. the first local doping concentration minimum is located in a depth of about 0.8 µm, whereas in FIG. 22 the depth of doping concentration minimum of the doping reduction layer 40 is arranged in a depth of about 1.0 µm.

FIG. 23 exemplarily shows a doping profile for a doping reduction layer 4 made of three implants for a device, e.g. a JBS diode, having a p doped layer (e.g. guard rings 38 or JTE 36 or p anode layer 7 on the first main side 14, the figure showing schematically such p doped layer 3,7, which is deeper). The doping reduction layer 4 is arranged in a depth range between 4 to 8 µm. In FIG. 23 the depth of doping concentration minimum of the doping reduction layer 40 is at 4.8 µm.

For the ion being helium and a device comprising p doped layers 3 and/or 7, an implantation energy between 500 to 2500 keV or 300 to 1500 keV may be applied. An implant dose between $3*10^9$ cm$^{-2}$ to $1*10^{13}$ cm$^{-2}$ or $5*10^9$ cm$^{-2}$ to $1*10^{12}$ cm$^{-2}$ may exemplarily be applied. For a device having no p doped layer 3, 7 on the first main side 14, lower implantation energies may be applied, exemplarily between 300 to 2500 keV or between 200 to 1500 keV.

Different edge terminations may be applied in the edge region 12 for reducing/stopping of the electric field towards the edge of the device. Exemplarily, floating metal rings 6 may be applied on the first main side 14 in order to reduce the electric field in the edge region 12. Such rings are floating and one or more rings surrounding each other may be applied. The floating metal rings 6 may be applied before or after step d). If applied before, a pattern as shown in FIG. 9 may be created.

At least one p termination layer 3 may be created on the first main side 14 by implantation of a p ion (second ion) and annealing in the edge region 12 on the first main side 14 up to a maximum termination layer depth 32 and annealing the termination layer 3. A mask may be applied covering the central region 10 such that a junction termination extension 36 and/or guard ring 38 is restricted to an area in the edge region 12. JTE region(s) 36 as well as guard ring(s) 38 extend to the surface of the device.

Simultaneously with the creation of a p doped termination layer 3 (JTE region 36 and/or guard rings 38) or successively at least one p doped anode layer 7 may be formed in the central region 10. One anode layer 7 may be formed or a plurality on anode layers 7 may be formed, so that a plurality of device cells are formed. The anode layer 7 may have the same maximum depth and doping concentration as the termination layer 3, but it is also possible to have different doping concentration/depth for anode layer 7 and termination layer 3. Exemplarily, the doping reduction layer 4 is created below the deepest lying p doped layer 3 and 7.

Different masks may be applied and the second ion may be applied with various implantation energies and/or implantation doses such that the JTE region 36 may comprise regions of different depths. Exemplarily, the JTE region closest to the central region 10 is created with the highest implantation energy and/or highest implantation dose and applied energy and/or dose get successively lower towards the edge of the device so that the JTE regions have a greater depth/doping concentration closer to the central region 10 and decrease towards the edge of the device. For a device comprising also at least one anode layer 7, the JTE region 36 may be connected to the anode layer 7 or it may be separated from it by the drift layer 2.

Another mask may also be applied for the creation of at least one p doped guard ring 38 as termination layer 3. The mask may have ring formed openings in the edge region 12 such that p doped regions closed in themselves as guard rings 38 may be created, wherein the p doped guard rings 38 are separated from each other by the drift layer 2. One guard ring 38 or at least two or at least five or at least ten guard rings 38, which surround each other and which are separated from each other by the drift layer 2, may be created.

JTE region(s) 36 may also be created together and overlapping with guard rings 38. In this case the JTE region(s) 36 are created with a lower implantation dose, but higher implantation energy than the guard ring(s) 38 so that lower doped JTE region(s) 36 are created, in which higher doped guard ring(s) 38 are embedded. Exemplarily, the JTE region(s) 36 are wider than guard rings 38. Exemplarily, the JTE region(s) extend to the edge of the device. The width shall be defined in a plane parallel to the first main side 14 the shortest distance between the surface of the layer closer to the central region 10 and the surface of the layer closer to the edge of the device. Exemplarily, JTE regions have a width between 5 and 500 µm, whereas the width of a guard ring is between 0.5 and 20 µm.

For a device comprising a termination layer(s) 3 the implantation energy for the creation of the doping reduction layer 4 may be chosen such that the minimum doping reduction layer depth 42 is greater than the maximum termination layer depth 32, i.e. the doping reduction layer 4 is created below the termination layer 3 (i.e. deeper than the termination layer 3 from the first main side 14). In another embodiment, the doping concentration minimum 40 of the doping reduction layer 4 may be shallower than the maximum depth 32 of the p doped termination layer 3. The maximum ion energy, and thereby the maximum depth 42 of the doping reduction layer 4 may be chosen so high that the maximum depth 42 is located in a depth from the first main side 14, which is deeper than the maximum depth 32 of the p doped termination layer 3.

Such inventive edge termination structures may be applied in different kind of silicon carbide power semiconductor devices well known to experts in the field like a Schottky diode or a merged pin Schottky diode or a junction barrier Schottky diode or a P-i-N diode or a MOSFET or an insulated gate bipolar transistor (IGBT) or a Junction Field Effect Transistor (JFET), exemplarily a reverse conducting (RC) IGBT, which may exemplarily be designed as a BIGT (Bimode Insulated Gate Transistor). In U.S. Pat. No. 8,212,283 B2 such a reverse-conducting insulated gate bipolar transistor (RC-IGBT) in form of a Bi-mode Insulated Gate Transistor (BIGT) is described, which document is incorporated by reference for the definition of a BIGT.

REFERENCE LIST 1 n doped SiC substrate
10 central region
12 edge region
14 first main side
16 second main side
18 device thickness
2 n− doped drift layer
3 p doped termination layer
32 maximum termination layer depth
36 junction termination extension
38 guard ring 39 Passivation layer (semi-insulating/insulating layer)
4 doping reduction layer
40 depth of doping concentration minimum of the doping reduction layer
42 maximum doping reduction layer depth
44 doping reduction layer depth range
46 doping reduction region
460 minimum doping reduction region depth
462 maximum doping reduction region depth
464 doping reduction region depth range
5 mask
50 metal electrode
52 metal electrode
6 floating metal ring
7 p doped anode layer

The invention claimed is:

1. A method for manufacturing an edge termination structure for a silicon carbide power semiconductor device having a central region and an edge region between a first main side and a second main side opposite to the first main side, the method comprising:
   a) providing an n doped silicon carbide substrate having the second main side as one main side,
   b) epitaxially growing a silicon carbide n-doped drift layer on a side opposite to the second main side, which has a lower doping concentration than the substrate, wherein the side of the drift layer opposite to such side, at which the silicon carbide substrate is arranged, forms the first main side,
   c) creating at least one p doped termination layer by implanting a second ion up to a maximum termination layer depth and annealing on the first main side,
   d) forming an (n−−) doped doping reduction layer having a doping reduction layer depth range between a depth of a doping concentration minimum of the doping reduction layer below the first main side up to a maximum doping reduction layer depth, wherein a depth of a doping concentration minimum of the doping reduction layer is greater than the maximum termination layer depth, which doping reduction layer comprises at least one doping reduction region, wherein for the creation of each doping reduction region:
      implanting hydrogen or helium as a first ion with an implantation energy on the first main side at least in the edge region,
      wherein the first ion is implanted in a doping reduction region depth range between a depth of a doping concentration minimum of the doping reduction region below the first main side up to a maximum doping reduction region depth,
      wherein the first ion and the at least one implantation energy are chosen such that the doping reduction layer depth range is less than 10 µm,
   e) annealing the doping reduction layer,
   wherein step d) is performed such that the doping concentration of the drift layer is reduced in the doping reduction layer and
   wherein in step d) the first ion is implanted with at least two different implantation energies.

2. The method according to claim 1, wherein in step d) a plurality of doping reduction regions is formed with different implantation energies, wherein the plurality of doping reduction regions overlap with each other such that forming a continuous doping reduction layer.

3. The method according to claim 1, wherein in step d) the at least one implantation energy is chosen such that the at least one doping reduction region depth range is less than 1 μm.

4. The method according to claim 1, wherein the doping concentration in the doping reduction layer is between 25 to 75% of the doping concentration of the drift layer.

5. The method according to claim 1, wherein in step d) a mask or a metal electrode as a mask is applied on the central region on the first main side such that the first ion is applied only in the edge region.

6. The method according to claim 1, wherein the first ion is hydrogen and the first ion is implanted with at least one implantation energy between 100 to 1000 keV and an implant dose between $5*10^9$ cm$^{-2}$ to $1*10^{14}$ cm$^{-2}$.

7. The method according to claim 1, wherein the first ion is hydrogen and the first ion is implanted with at least one implantation energy between 300 to 800 keV and an implant dose between $1*10^{10}$ cm$^{-2}$ to $1*10^{13}$ cm$^{-2}$.

8. The method according to claim 1, wherein the first ion is helium and the first ion is implanted with at least one implantation energy between 500 to 2500 keV and an implant dose between $3*10^9$ cm$^{-2}$ to $1*10^{13}$ cm$^{-2}$.

9. The method according to claim 1, wherein the first ion is helium and the first ion is implanted with at least one implantation energy between 300 to 1500 keV and an implant dose between $5*10^9$ cm$^{-2}$ to $1*10^{12}$ cm$^{-2}$.

10. The method according to claim 1, wherein on the first main side in the edge region the at least one termination layer is created, which is at least one of:
   a junction termination extension,
   one guard ring, and
   at least two guard rings, which surround each other and which are separated from each other by the drift layer.

11. A method for manufacturing a power semiconductor device having an edge termination structure, wherein the edge termination structure is manufactured according to claim 1.

12. The power semiconductor device according to claim 1, wherein the at least termination layer is a junction termination extension,
   one guard ring, and
   at least two guard rings, which surround each other and which are separated from each other by the drift layer.

13. The method according to claim 1, wherein in step d) the first ion is implanted with three to ten different implantation energies.

14. The method according to claim 1, wherein in step d) the first ion is implanted with three to six different implantation energies.

15. The method according to claim 1, wherein in step d) the at least one implantation energy is chosen such that the at least one doping reduction region depth range is less than 0.6 μm.

16. The method according to claim 1, wherein in step d) the at least one implantation energy is chosen such that the at least one doping reduction region depth range is between 0.2 to 0.5 μm.

17. A silicon carbide power semiconductor device having a central region and an edge region between a first main side and a second main side opposite to the first main side,
   wherein an n doped silicon carbide substrate layer is arranged on the second main side,
   an n-doped silicon carbide drift layer, which is lower doped than the silicon carbide substrate layer, is arranged on the first main side, in the edge region on the first main side at least one p doped termination layer and an (n--) doped doping reduction layer is arranged, which has lower doping concentration than the drift layer,
   wherein the doping reduction layer is arranged in a doping reduction layer depth range between a depth of a doping concentration minimum of the doping reduction layer below the first main side up to a maximum doping reduction layer depth, wherein the depth of the doping concentration minimum of the doping reduction layer is deeper than the maximum termination layer depth, wherein the doping reduction layer depth range is less than 10 μm, wherein the doping reduction layer comprises a plurality of doping reduction regions, each of which has a depth of the doping concentration minimum of the doping reduction region, a maximum doping reduction region depth and a doping reduction region depth range being the deviation between the maximum doping reduction region depth and the depth of the doping concentration minimum and wherein each doping reduction region depth range is less than 1 μm.

18. The power semiconductor device according to claim 17, wherein each doping reduction region depth range is less than 0.6 μm.

19. The power semiconductor device according to claim 17, wherein the doping reduction regions overlap or are in touch with each other.

20. The method according to claim 2, wherein in step d) the at least one implantation energy is chosen such that the at least one doping reduction region depth range is less than 1 μm.

* * * * *